United States Patent
Moon et al.

(10) Patent No.: US 7,956,850 B2
(45) Date of Patent: Jun. 7, 2011

(54) TOUCH SENSOR AND SIGNAL GENERATION METHOD THEREOF

(75) Inventors: Byung-Joon Moon, Yongin-si (KR); Jae-Surk Hong, Yongin-si (KR)

(73) Assignee: Atlab Inc. (KR)

( * ) Notice: Subject to any disclaimer, the term of this patent is extended or adjusted under 35 U.S.C. 154(b) by 739 days.

(21) Appl. No.: 11/917,077

(22) PCT Filed: May 17, 2006

(86) PCT No.: PCT/KR2006/001841
§ 371 (c)(1), (2), (4) Date: Dec. 10, 2007

(87) PCT Pub. No.: WO2006/135152
PCT Pub. Date: Dec. 21, 2006

(65) Prior Publication Data
US 2008/0204422 A1   Aug. 28, 2008

(30) Foreign Application Priority Data
Jun. 16, 2005   (KR) ........................ 10-2005-0052111

(51) Int. Cl.
*G06F 3/041* (2006.01)
(52) U.S. Cl. ....................................................... 345/173
(58) Field of Classification Search .................... 345/173
See application file for complete search history.

(56) References Cited

U.S. PATENT DOCUMENTS

| | | |
|---|---|---|
| 4,145,748 A | 3/1979 | Eichelberger et al. |
| 5,650,597 A | 7/1997 | Redmayne |

(Continued)

FOREIGN PATENT DOCUMENTS

JP   56-165419   12/1981

(Continued)

OTHER PUBLICATIONS

International Search Report for corresponding International Application No. PCT/KR2006/001841 dated May 17, 2006.

(Continued)

*Primary Examiner* — Amare Mengistu
*Assistant Examiner* — Jennifer Zubajlo
(74) *Attorney, Agent, or Firm* — Cantor Colburn LLP

(57) ABSTRACT

A touch sensor and a signal generation method thereof are provided. The touch sensor includes: an input signal generation unit generating an input signal; a reference signal generation unit delaying the input signal by a predetermined time to generate a first signal; a plurality of touch sensing signal generation units having a touch pad and delaying the input signal differently according to whether or not the touch pad is touched to generate a second signal; a plurality of variable delay units varying a delay time in response to a control signal and delaying the second signal in response to the varied delay time to generate a varied second signal; a plurality of touch signal generation units generating a touch signal according to a difference in delay time between the first signal and the second signal; and a control unit receiving and analyzing the plurality of touch signals, generating touch outputs when the touch pad is in a touched state, and supplying the control signals to the variable delay units when the touch pad is in a standby state. Accordingly, the delay value may be automatically adjusted even when the delay value, which has been initially set, is varied due to an external environment, so that the touch pad may be prevented from being mis-operated.

15 Claims, 8 Drawing Sheets

U.S. PATENT DOCUMENTS

| | | | |
|---|---|---|---|
| 5,760,688 | A | 6/1998 | Kasai |
| 5,880,411 | A | 3/1999 | Gillespie et al. |
| 2002/0091952 | A1 | 7/2002 | Lin et al. |

FOREIGN PATENT DOCUMENTS

| | | | |
|---|---|---|---|
| JP | 08-327392 | | 12/1996 |
| JP | 08327392 A | * | 12/1996 |
| JP | 2000-134078 | | 5/2000 |
| JP | 2004-146099 | | 5/2004 |
| JP | 2004-206288 | | 7/2004 |
| KR | 2002-0009760 | | 2/2002 |

OTHER PUBLICATIONS

Written Opinion of the International Searching Authority for corresponding International Application No. PCT/KR2006/001841 dated May 17, 2006.

Taiwan Office Action issued May 7, 2009 with English Translation.

Japanese Office Action—Japanese Patent Application No. 2008-515618 issued Jun. 22, 2010, citing JP08-327392.

* cited by examiner

TOUCH SENSOR AND SIGNAL GENERATION METHOD THEREOF

TECHNICAL FIELD

The present invention relates to an electrical touch sensor, and more particularly, to a touch sensor and a signal generation method thereof, that are capable of automatically adjusting delay time variations without a procedure of adjusting a value of a capacitor or the like in a production process to correct the delay time of an initially set delay time due to change in environment such as temperature, operating power supply voltage, and moisture.

BACKGROUND ART

In general, values such as delay times of signals generated in a typical electrical touch sensor are set in the production process, so that it is impossible to adjust the set values even when the values varies due to several factors in actual use.

FIG. 1 is a block diagram showing the configuration of a conventional touch sensor, which has an input signal generation unit 10, a reference signal generation unit 20, a plurality of touch sensing signal generation units 30-1 to 30-$n$, and a plurality of touch signal generation units 40-1 to 40-$n$.

Referring to FIG. 1, the input signal generation unit 10 generates an Alternate Current (AC) signal or a clock signal as an input signal R_Sig and applies it to the reference signal generation unit 20 and each of the touch sensing signal generation units 30-1 to 30-$n$.

The reference signal generation unit 20 always delays an input signal R_Sig by a predetermined time regardless of whether a touch pad is touched with an object, thereby generating a reference signal Sig1.

The touch sensing signal generation units 30-1 to 30-$n$ have respective touch pads PAD with which the object is touched, and generate sensing signals Sig2-1 to Sig2-$n$. The delay time of each sensing signal when the touch pad is touched with the object is longer than that of each sensing signal when the touch pad is not touched with the object.

Here, any object having a predetermined capacitance can be the object, and a representative example thereof is a human body capable of storing a large amount of charges.

The touch signal generation units 40-1 to 40-$n$ sample and latch the sensing signals Sig2-1 to Sig2-$n$ outputting from the respective touch sensing is signal generation units 30-1 to 30-$n$ in synchronization with the reference signal Sig1. And, the touch signal generation units 40-1 to 40-$n$ output respective touch signals S1 to Sn.

FIG. 2 is a circuit diagram showing the detailed configuration of the touch sensor of FIG. 1.

Referring to FIG. 2, the reference signal generation unit 20 is composed of a first resistor R1 and a capacitor C, each of the touch sensing signal generation units 30-1 to 30-$n$ is composed of second resistor R2-1 to R2-$n$ and pads, and each of the touch signal generation units 40-1 to 40-$n$ is composed of a D flip-flop.

The first resistor R1 and the capacitor C are set such that each of the delay times between the input signal generation 10 and the D input of each flip-flop is shorter than the delay time between the input signal generation 10 and the capacitor C when the touch pad PAD is not touched with the object, and each of the delay times between the input signal generation 10 and the D input of each flip-flop is longer than the delay time between the input signal generation 10 and the CLK input of each flip-flop when the touch pad PAD is touched with the object.

The second resistors R2-1 to R2-$n$ are set to match delay components between the input signal generation unit 10 and the respective touch pads PAD to be equal to each other. And each of the touch pad PADs acts to generate a capacitance corresponding with a capacitance of the object.

That is, a delay time of the reference signal generation unit 20 is constant regardless of whether a touch pad is touched with an object. And each delay time of the touch signal generation units 30-1 to 30-$n$ is shorter than the reference signal generation unit 20 when each corresponding touch pad PAD is not touched with the object, but each delay time of the touch signal generation units 30-1 to 30-$n$ is longer than the reference signal generation unit 20 when the touch pad PAD is touched with the object.

The D flip-flops 40-1 to 40-$n$ are triggered in synchronization with the reference signal Sig1, and latch and output the sensing signals Sig2-1 to Sig2-$n$.

Each touch sensing signal generation unit might have different delay when the touch pad PAD is not touched with the object. That is, product values of the resistors R2-1 to R2-$n$ and the capacitor from the PAD could be different from each other. Here, the capacitor is mainly from line lengths between a touch pad and a touch signal generation unit. The line lengths may not be equal in actual application and the resistors R2-1 to R2-$n$ may not be equal due to their variation. Thus, each sensing signal delay against the reference signal delay may vary for different line lengths between the touch pad and the touch signal generation unit, so that means for correcting delays to be the same in the production process are strongly demanded to realize equal sensitivity for all touch pads.

Even when such problems are solved in the production process, circumstances such as temperature, operating power supply voltage, and moisture, or set values or durability of discrete elements such as resistors or capacitors disposed within the touch sensor may vary in actual use. Consequently, delay times between the reference signal and the sensing signal may vary from the initially set value, which thus prevents the touch sensor from keeping precise sensitivity.

DISCLOSURE

Technical Problem

In order to solve the foregoing and/or other problems, it is an objective of the present invention to provide a touch sensor having a function of automatically adjusting a delay time to keep precise sensitivity and to prevent malfunction of the touch sensor in advance, and a signal generation method thereof.

Technical Solution

In one aspect, the invention is directed to a touch sensor including: an input signal generation unit generating an input signal; a reference signal generation unit delaying the input signal by a predetermined time to generate a first signal; a plurality of touch sensing signal generation units having a touch pad and delaying the input signal differently according to whether or not the touch pad is touched to generate a second signal; a plurality of variable delay units varying a delay time in response to a control signal and delaying the second signal in response to the varied delay time to generate a varied second signal; a plurality of touch signal generation units generating a touch signal according to a difference in delay time between the first signal and the second signal; and a control unit receiving and analyzing the plurality of touch signals, generating touch outputs when the touch pad is in a touched state, and supplying the control signals to the variable delay units when the touch pad is in a standby state.

The reference signal generation unit may have a plurality of serially connected inverters.

The reference signal generation unit may have a capacitor connected to a ground voltage.

Each of the touch sensing signal generation units may generate the second signal by delaying the input signal longer than the first signal when the touch pad is in a touched state and by delaying the input signal shorter than the first signal when the touch pad is not in a touched state.

Each of the variable delay units may have a plurality of delay components and receive the control signals from the control unit so that some of the delay components may be activated in response to the control signals, and may delay the second signals by delay times of the activated delay components to output the varied second signals.

Each of the delay components may have a multiplexer outputting one of two inputs in response to the control signal, and a plurality of inverters receiving an output of the multiplexer as an input and delaying the input by a predetermined time to output the input.

Each of the touch signal generation units may be a flip-flop which latches the varied second signal in response to the first signal and generates the touch signal.

Each of the touch signal generation units may be a flip-flop which latches the first signal in response to the varied second signal and generates the touch signal.

In the standby state, the control unit holds the most recent touch outputs until delay calibrations which actually are adjustments of the control signals to all of the variable delay units are completed.

The control unit may sequentially supply the control signals to the respective variable delay units and those adjustments of the control signals to the variable delay units should be done only when the touch pad is not in the touched state. The delay calibration is cancelled when the touch pad turns to be in the touched state.

The control unit may supply the control signal and obtain the delay value as the minimum delay value beyond that the touch signal generation unit will have it's output to indicate the touched state. The control unit uses the minimum delay value to adjust a sensitivity of the touch pad.

In another aspect, the invention is directed to a signal generation method of a touch sensor including: generating an input signal; delaying the input signal by a predetermined time to generate a first signal; delaying the input signal differently according to whether a touch pad is touched to generate a second signal; varying a delay time in response to a control signal and delaying the second signal in response to the varied delay time to generate a varied second signal; generating a touch signal according to a difference in delay time between the first signal and the second signal; and receiving and analyzing the touch signal, generating a touch output when the touch pad is in a touched state, and adjusting the control signal when the touch pad is in a standby state.

Adjusting the control signal may have holding the most recent touch outputs in the standby state, varying the control signal, and receiving the touch signal to obtain a minimum delay value; and adjusting the control signal using the obtained minimum delay value.

Obtaining the minimum delay value may have obtaining the control signal as the minimum delay value when a value of the touch signal becomes a value indicating that the touch pad is in a touched state while varying the control signal.

Adjusting the control signal may have checking whether the adjustment of the control signal is performed in a normal condition; determining the control value using the obtained minimum delay value, and generating the determined control value as the control signal upon determination that the adjustment is performed in the normal condition; and releasing the holding of the touch output upon determination that the adjustment is not performed in the normal condition.

Adjusting the control signal may have releasing the holding of the touch output when the adjustment of the control signal is completed.

The control value may be determined by calculating a difference between the minimum delay value and a touch sensitivity of the touch pad.

The normal condition may be a condition that a touch pad is not touched with an object.

Advantageous Effects

According to the present invention as described above, a touch sensor and a signal generation method thereof automatically adjust the delay time changes of the internal signals of the touch sensor which occur due to change in environment such as temperature, operating power supply voltage, and moisture during the operation of the touch sensor without additional external adjustment, so that the mis-operation associated with a touch of the touch sensor may be prevented.

DESCRIPTION OF DRAWINGS

The foregoing and other objects, features and advantages of the invention will be apparent from the more particular description of a preferred embodiment of the invention, as illustrated in the accompanying drawings. The drawing is not necessarily to scale, emphasis instead being placed upon illustrating the principles of the invention.

BEST MODE

Hereinafter, the touch sensor and the signal generation method thereof will be described with reference to the accompanying drawings.

Figure 3:
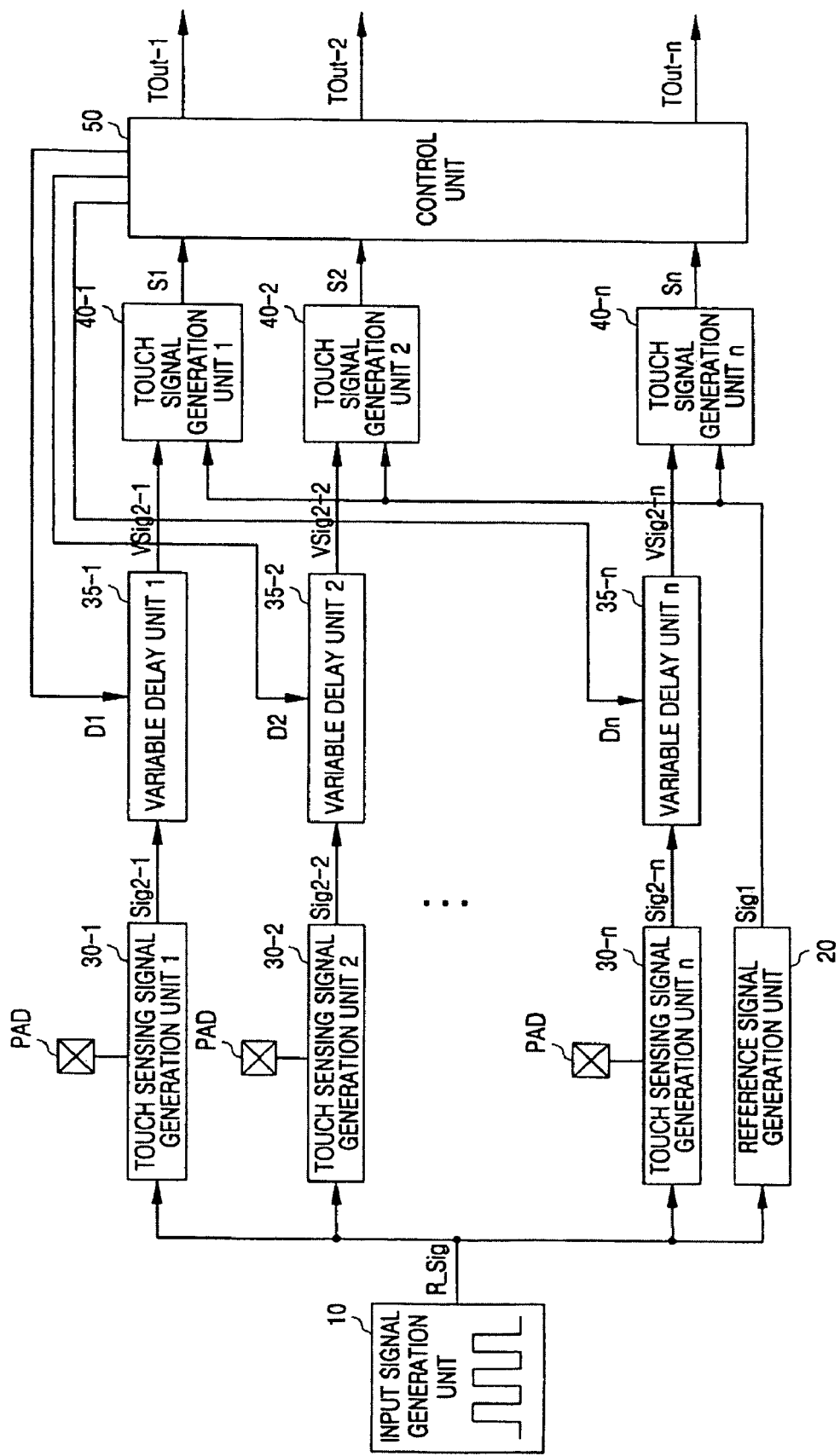
FIG. 3 is a block diagram showing the configuration of a touch sensor in accordance with an exemplary embodiment of the present invention.

FIG. 3 is a block diagram showing the configuration of a touch sensor in accordance with an exemplary embodiment of the present invention.

As shown in FIG. 3, the touch sensor of the present invention includes an input signal generation unit 10, a reference signal generation unit 20, a plurality of touch sensing signal generation units 30-1 to 30-$n$, a plurality of variable delay units 35-1 to 35-$n$, a plurality of touch signal generation units 40-1 to 40-$n$, and a control unit 50.

The input signal generation 10 generates an AC signal or a clock signal as an input signal R_Sig and applies it to the reference signal generation unit 20 and each of the touch sensing signal generation units 30-1 to 30-n.

The reference signal generation unit 20 always delays the input signal R_Sig by a predetermined time regardless of whether a touch pad is touched with an object to generate a reference signal Sig1.

Each of the touch sensing signal generation units 30-1 to 30-n has a touch pad PAD to be touched with an object, delays the input signal R_Sig by a delay time longer than the delay time of the reference signal Sig1 when the touch pad PAD is touched with the object, and delays the input signal R_Sig by a delay time shorter than the delay time of the reference signal Sig1 when the touch pad PAD is not touched with the object, thereby generating the sensing signals Sig2-1 to Sig2-n having delay times different from the delay time of the reference signal Sig 1.

Any object having a predetermined capacitance may be applied to the object which touches on the PAD, and a representative example thereof is a human body capable of storing a large amount of electric charges.

The variable delay units 35-1 to 35-n vary the delay times of the sensing signals Sig2-1 to Sig2-n in response to control signals D1 to Dn supplied from the control unit 50, and output variable delay signals VSig-1 to VSig-n in response to the varied delay times, respectively.

The touch signal generation units 40-1 to 40-n sample and latch the variable delay signals VSig-1 to VSig-n in synchronization with the reference signal Sig1, and output touch signals S1 to Sn, respectively.

The control unit 50 senses that the touch sensor is in an operation mode when the touch pad PAD is touched with the object and the touch signals S1 to Sn are continuously changed, and receives the touch signals S1 to Sn from the touch signal generation units 40-1 to 40-n corresponding to the touch pad PAD touching the object to generate touch outputs TOut-1 to TOut-n. Alternatively, the control unit 50 senses that the touch sensor is in a standby mode when the touch pad PAD is not touched with the object and the touch signals S1 to Sn are not changed for a predetermined time, and starts a adjustment of the delay time of the variable delay units 35-1 to 35-n through a adjustment of the control signals D1 to Dn.

The control unit 50 holds the most recent touch outputs TOut-1 to TOut-n of the respective touch pads PAD, and sequentially adjusts the control signals D1 to Dn for the respective variable delay units 35-1 to 35-n in order to prevent the adjustment of the delay time from affecting general operation of the touch sensor.

The control unit 50 varies the control signals D1 to Dn to repeatedly control the delay times of the respective variable delay units 35-1 to 35-n so that it obtains delay times when values of the touch signals S1 to Sn start to be the same as values occurring when the touch pad PAD is in a touched state, that is, it extracts control values of the control signals as minimum delay values D1(TH) to Dn(TH).

For example, on the assumption that the touch signal S1 has a logical "High" level when the touch pad is touched with the object and has a logical "Low" level when the touch pad is not touched with the object, the control unit 50 repeatedly performs adjusting the delay time of the respective variable delay unit 35-1 and receiving the touch signal S1 corresponding to the adjusted delay time and obtains control values D1 as minimum delay value D1(TH) when logic level of the touch signal S1 translates "Low" level into "High" level. And the control unit 50 calculates differences between the minimum delay values D1(TH) and the pre-defined sensitivity value of the touch pads to determine the control value, and transmits the determined control value to the variable delay unit 35-1 as the control signal D1, thereby sufficiently securing an error margin of the touch sensor.

That is, the control unit 50, while considering the touch sensitivity of the touch pad PAD when the touch pad PAD is not in a touched mode in order to have correct touch outputs S1 to Sn generated when the touch pads PAD is touched with the object, controls the variable delay units 35-1 to 35-n such that the delay time of the reference signal Sig1 and each delay time of the variable delay signals VSig2-1 to VSig2-n are different from each other, thereby and outputs the variable delay signals VSig2-1 to VSig2-n.

The sensitivity of the touch pad increases according to the size of the touch pad and is an obtained value from repeated experiments.

The control unit 50 then checks whether the touch sensor is in a normal condition before the adjustment of the delay time for each variable delay unit was executed, cancels the adjustment of the delay time for the variable delay unit and remains in a standby mode for the next adjustment, and performs the adjustment of the delay time for the next variable delay unit when the delay time adjustment was performed in the normal condition. And the control unit 50 releases the holding of the touch outputs TOut-1 to TOut-n when the adjustment of the delay time for all of the variable delay units is completed such that the touch outputs TOut-1 to TOut-n are renewed to new values according to the touch inputs on the touch PADs.

Here, the normal condition is a condition that the touch pad PAD is not being touched with the object.

Figure 4A:
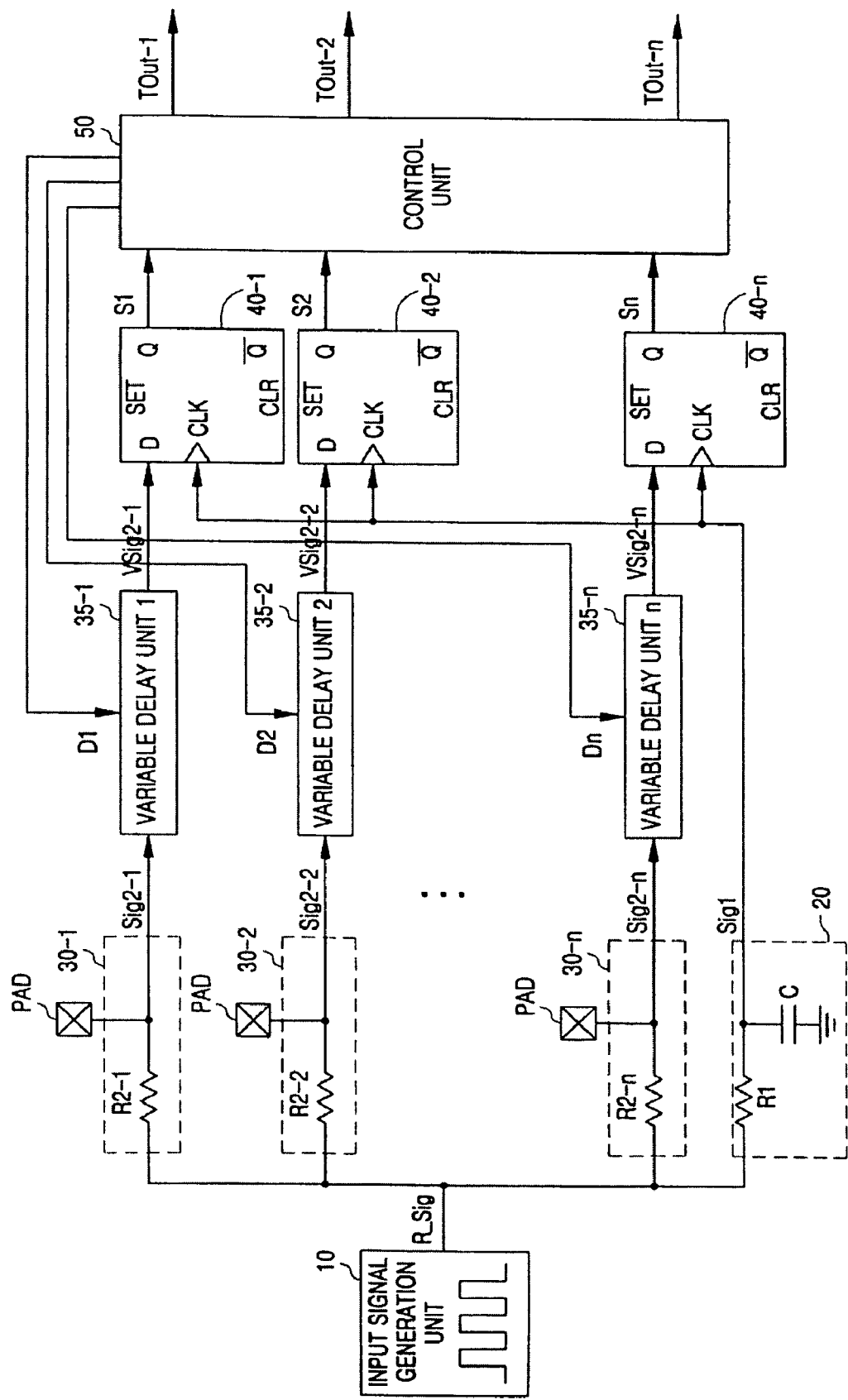
FIGS. 4A and 4B are circuit diagrams showing the detailed configuration of the touch sensor of FIG. 3.
Figure 4B:
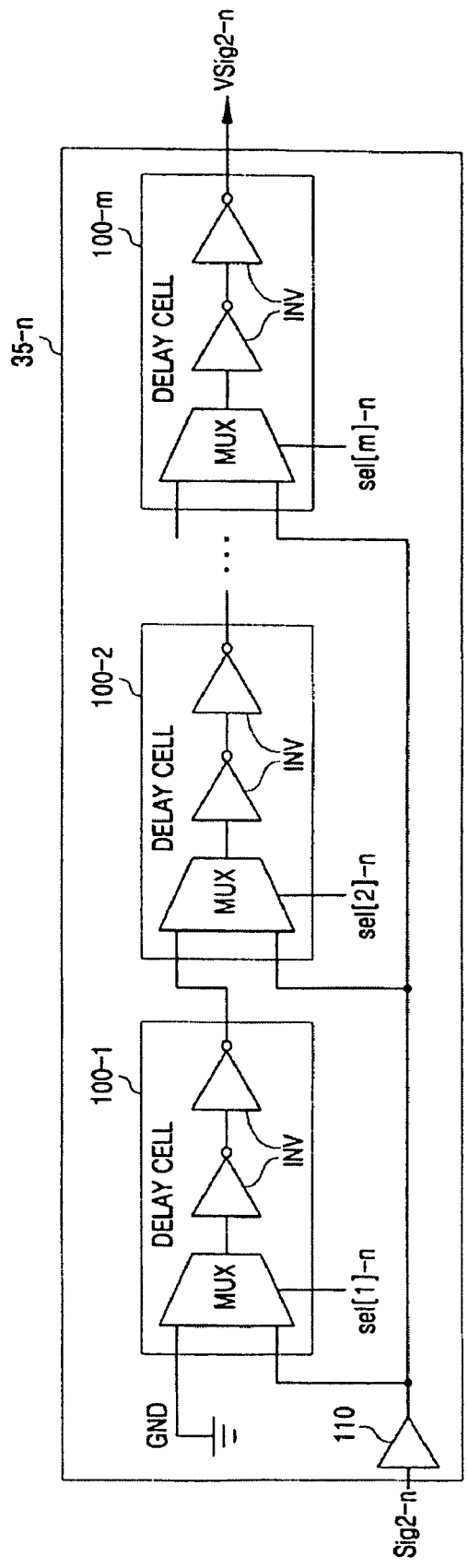

FIGS. 4A and 4B are circuit diagrams showing the detailed configuration of the touch sensor of FIG. 3.

A reference signal generation unit 20 is composed of a first resistor R1 and a capacitor C.

Although not shown in FIG. 4A, it is apparent that the reference signal generation unit 20 may be composed of a plurality of inverters which are serially connected to one another and have predetermined delay times to perform the same function instead of the delay circuit composed of the first resistor R1 and the capacitor C.

Touch sensing signal generation units 30-1 to 30-n have second resistors R2-1 to R2-n disposed between an input signal generation unit 10 and variable delay units 35-1 to 35-n, and touch pads PAD. Touch pads PAD allowing objects having capacitances to be touched are disposed between the second resistors R2-1 to R2-n and the variable delay units 35-1 to 35-n, respectively.

Figure 1:
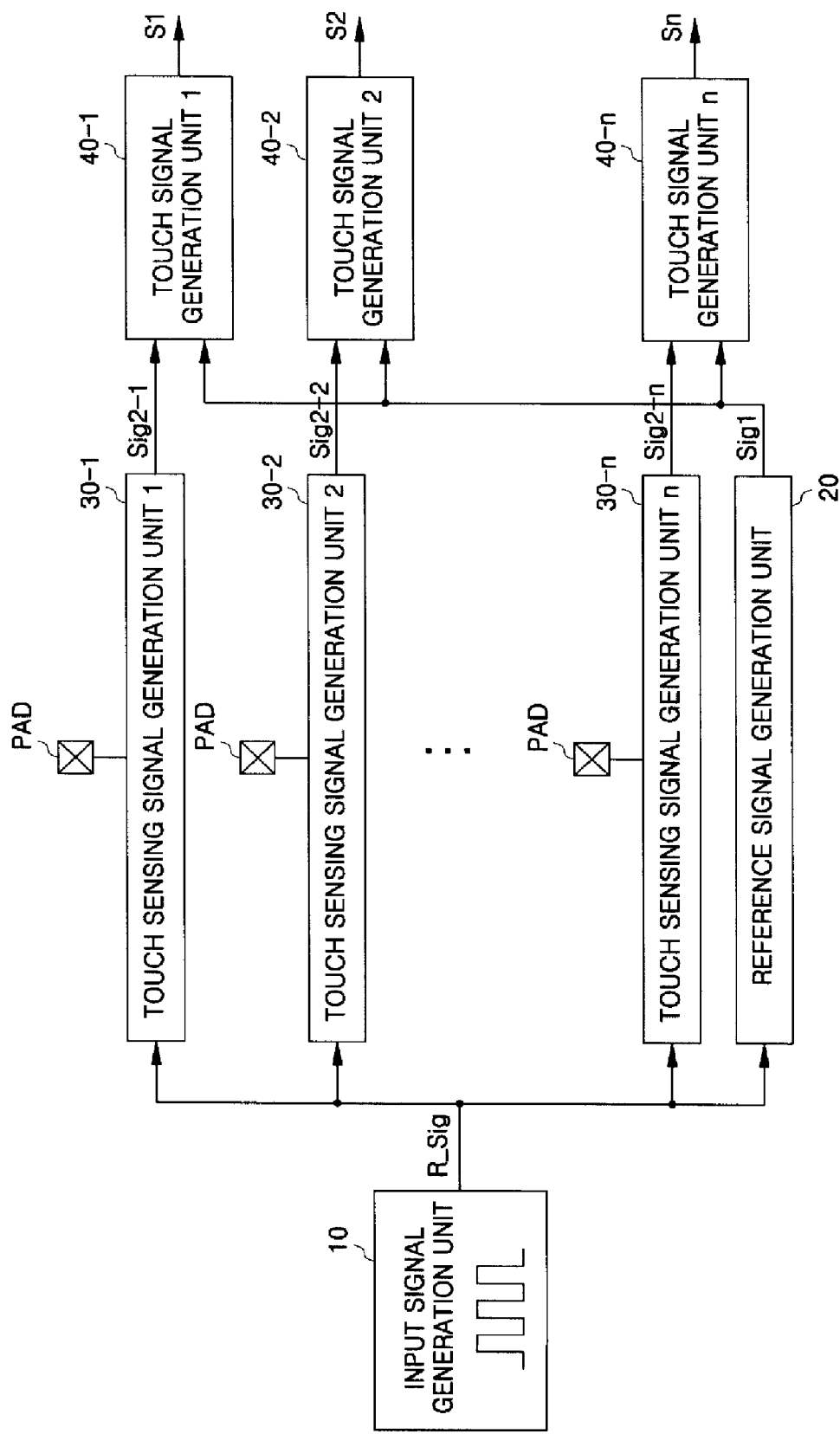
FIG. 1 is a block diagram showing the configuration of a conventional touch sensor.
Figure 2:
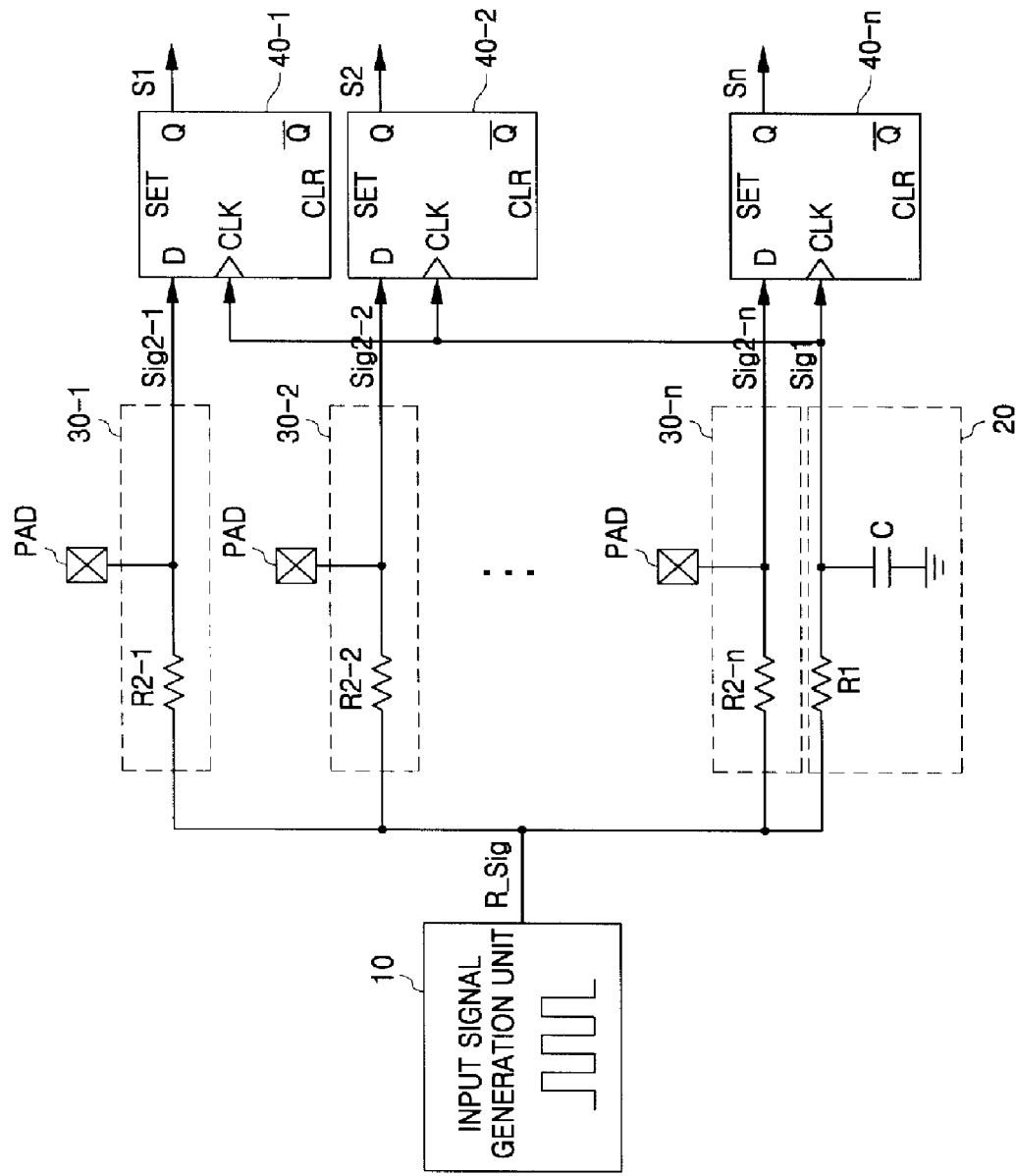
FIG. 2 is a circuit diagram showing the detailed configuration of the touch sensor of FIG. 1.

In here, functions of the first resistor R1, the capacitor C, and the second resistors R2-1 to R2-n are the same as those described with reference to FIG. 2.

Touch signal generation units 40-1 to 40-n are composed of respective D flip-flops, which receive variable delay signals VSig2-1 to VSig2-n as inputs D from the respective variable delay units 35-1 to 35-n and receive a reference signal Sig1 of the reference signal generation unit 20 as a clock input CLK to generate touch signals S1 to Sn.

The variable delay unit 35-n may be composed of a buffer 110 and a plurality of delay cells 100-1 to 100-m, and each of the delay cells 100-1 to 100-m may be composed of one multiplexer MUX and two inverters INV as shown in FIG. 4B.

The multiplexer MUX has two inputs, one output, and a selection input for selecting one input of the two inputs, and values of the selection inputs sel[1]-n to sel[m]-n are controlled by a control signal Dn supplied from a control unit 50. The two inverters INV delay an output of the multiplexer MUX by a predetermined time.

Referring to FIG. 4B, the delay cell 100-1 receives a ground voltage GND and a sensing signal Sig2-$n$ as its input, and outputs either a ground voltage GND or a sensing signal Sig2-$n$ according to selection input sel[1]-$n$. Each of the other delay cells 100-2 to 100-$m$ receives a sensing signal Sig2-$n$ and an output of the delay cell of the previous stage as its inputs, and outputs either a sensing signal Sig2-$n$ or an output of the delay cell of the previous stage according to the selection inputs sel[2]-$n$ to sel[m]-n, respectively. A buffer 110 buffers the sensing signal Sig2-$n$ to supply it to one input of the multiplexer MUX disposed in each of the delay cells 100-1 to 100-$m$.

In FIG. 4B, each of the delay cells 100-1 to 100-$m$ is composed of one multiplexer MUX and two inverters INV, but it may be composed of at least two inverters or other delay components. Also, in FIG. 4B, the variable delay unit 35-$n$ has only one buffer 110, but one buffer may be disposed per a predetermined interval of the delay cells in order to prevent the sensing signal Sig2-$n$ input to each of the delay cells from being attenuated. For example, one buffer may be disposed per an interval of 10 delay cells.

Figure 4C:
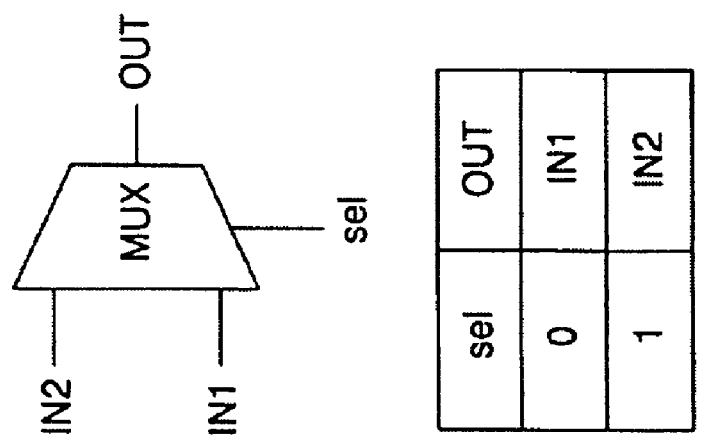
FIGS. 4C and 4D illustrate examples of the operation of a variable delay unit in the touch sensor of FIG. 4B.
Figure 4D:
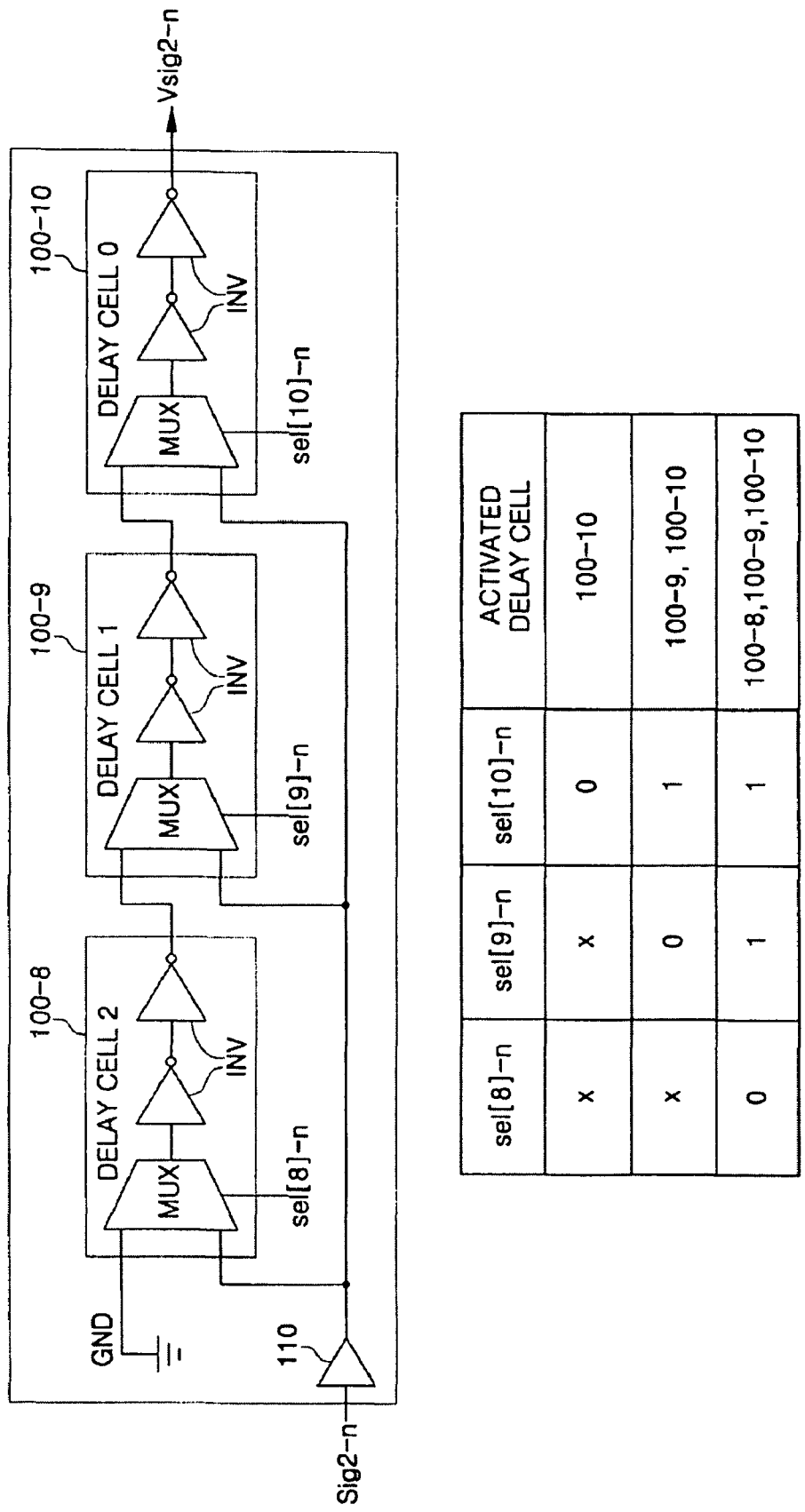

FIGS. 4C and 4D illustrate examples of the operation of the variable delay unit in the touch sensor of FIG. 4B. FIG. 4C shows the operation of the multiplexer MUX within the delay cell disposed in the variable delay unit. The multiplexer MUX outputs an input IN1 when the selection input of the multiplexer MUX is '0', and outputs an input IN2 when the selection input is '1' as shown in FIG. 4C.

FIG. 4D shows an example of the variable delay unit composed of three delay cells, which illustrates activated states of the delay cells according to a combination of selection inputs sel[8]-$n$ to sel[10]-$n$ on the assumption that the multiplexer MUX disposed in each of the delay cells operates in the manner as shown in FIG. 4C.

As shown in FIG. 4D, activated delay cells are different according to the combination of the selection inputs sel[8]-$n$ to sel[10]-$n$. The third delay cell (100-10) is activated when the combination of the selection inputs sel[8]-$n$ sel[9]-$n$ sel[10]-$n$ is 'xx0'. That is, the sensing signal Sig2-$n$ is delayed by a delay time corresponding to one delay cell 100-10 and then output.

In here, the selection input of the multiplexer MUX indicated as 'x' means "Don't Care" state.

When the combination of the selection inputs sel[8]-$n$ sel[9]-$n$ sel[10]-$n$ is 'x01', the second delay cell 100-9 and the third delay cell 100-10 are activated, and the sensing signal Sig2-$n$ is delayed by a delay time corresponding to the two activated delay cells 100-9 and 100-10 and then output.

When the combination of the selection inputs sel[8]-$n$ sel[9]-$n$ sel[10]-$n$ is '011', all the delay cells 100-8, 100-9, and 100-10 are activated, and the sensing signal Sig2-$n$ is delayed by a delay time corresponding to the three activated delay cells 100-8, 100-9, and 100-10 and then output.

In FIG. 4A, each of the touch signal generation units 40-1 to 40-$n$ is composed of a D flip-flop, however, in actual use, the touch signal generation unit may be composed of a JK flip-flop or a latch circuit, which is capable of obtaining and latching the variable delay signal VSig2-$n$ in synchronization with the reference signal Sig1.

The D flip-flop in synchronization with the reference signal Sig1 is described in the embodiment of the present invention, however, it is apparent that the D flip-flop may be configured to obtain and latch the reference signal Sig1 in synchronization with the variable delay signal VSig2-$n$ to output the touch signal Sn.

A plurality of touch pads and a plurality of touch sensing signal generation units corresponding to the pads are described in the embodiment of the present invention, however, it is apparent to those skilled in the art that a touch sensing signal generation unit, a variable delay unit, and a touch signal generation unit, which correspond to one touch pad in the touch sensor composed of the one touch pad, may also be implemented.

Figure 5:
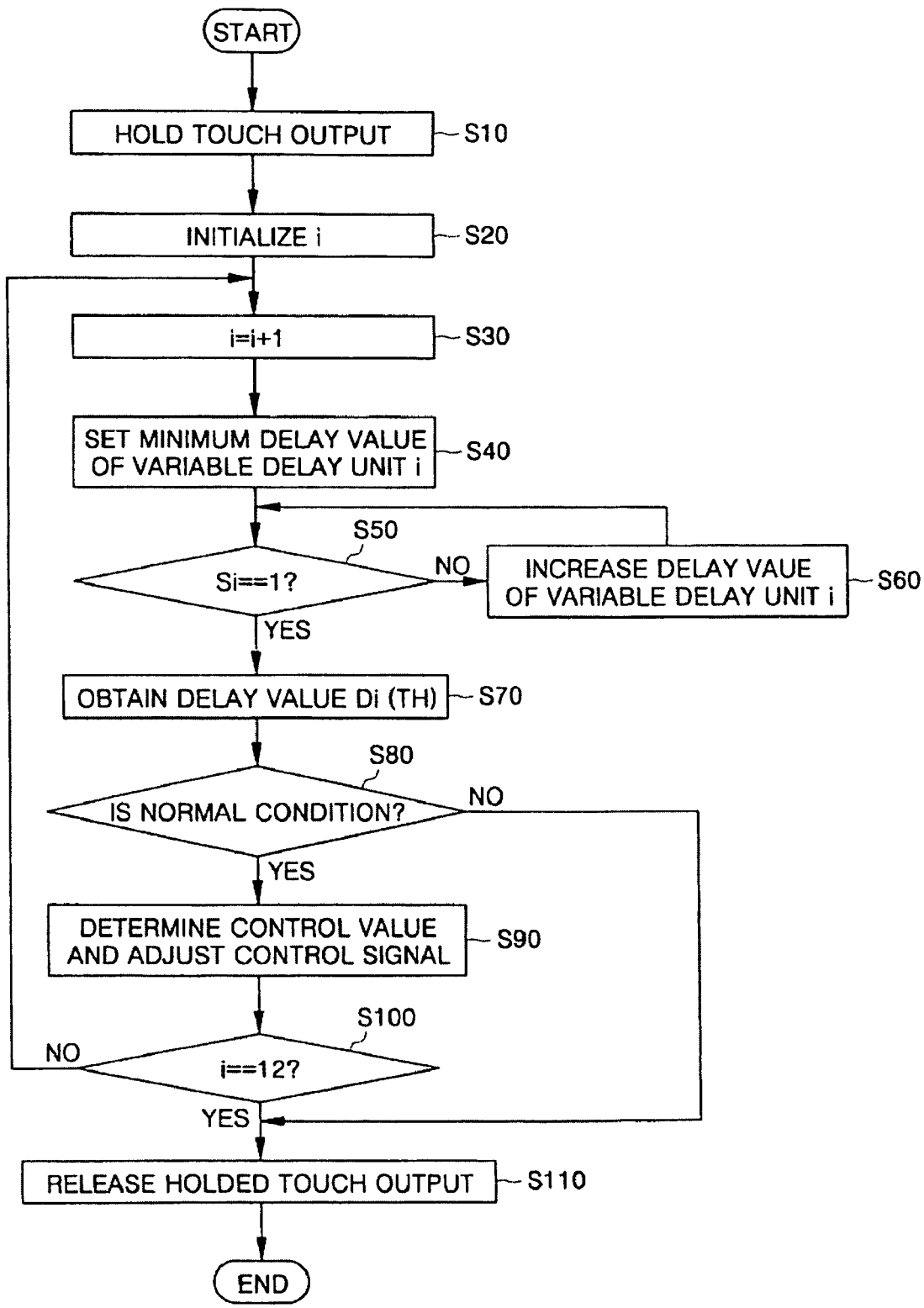
FIG. 5 is a flowchart showing the procedure of adjusting a delay time of the touch sensor in accordance with an exemplary embodiment of the present invention.

FIG. 5 is a flowchart showing the procedure of adjusting a delay time of the touch sensor in accordance with an exemplary embodiment of the present invention. In particular, it illustrates the procedure of adjusting the delay time performed by the control unit 50 of a touch sensor. It is assumed that the number of variable delay units is twelve in the embodiment of FIG. 5.

First, the control unit 50 holds the most recent touch output of the touch pad before starting to adjust the delay time to prevent the adjustment of the delay time of the variable delay unit from affecting general operation of the touch sensor (Step S10).

The control unit 50 then initializes an "i" value (Step S20). In here, "i" is set as zero in initial state. "i" indicates the order of the variable delay units which are included in the touch sensor and perform the adjustment of the delay time of the delay time.

The "i" value is then increased by one (Step S30). That is, "i" becomes one, and the adjustment of the delay time is carried out by the first variable delay unit 35-1 of FIGS. 4A and 4B.

The control unit 50 sets the delay value Di as a minimum value so that the number of activated delay cells included in the i-th variable delay unit 35-$i$ become the minimum (Step S40).

And the control unit 50 checks whether the value of the touch signal Si is equal to a value when the touch pad is in the touched state (Si=1) (Step S50).

When the value of the touch signal Si is not equal to a value when the touch pad is in the touched state (Si≠1), the control unit 50 increases the number of activated delay cells included in the i-th variable delay unit 35-$i$ by one to increase the delay value Di by one (Step S60), and repeats the previous step (Step S50).

When the value of the touch signal Si is equal to a value when the touch pad is in the touched state (Si=1), the control unit 50 obtains the delay value Di as the minimum delay value Di(TH) at this time (Step S70).

That is, the control unit 50 increases the delay value Di from the minimum value in a stepwise manner until the delay value Di is equal to the delay value of the touch signal occurring when the touch pad is in the touched state, so that it obtains, as the minimum delay value Di(TH) of the i-th variable delay unit 35-$i$.

The control unit 50 then checks whether the current adjustment of the delay time is performed in a normal condition (Step S80).

That is, the control unit 50 calculates a difference value between the minimum delay value Di(TH) obtained in the previous adjustment of the delay time and the minimum delay value Di(TH) obtained in the current adjustment operation, and compares the difference value with a pre-defined constant value that the difference will exceed only when the touch pad is touched with the object.

When the difference value is smaller than the pre-defined constant value, the control unit 50 determines the touch pads PAD are not touched with the object, and vice versa.

When it is determined that the adjustment of the delay time is carried out in the normal condition by Step S80, the control unit 50 calculates a control value of the variable delay unit using the minimum delay value Di(TH) and the sensitivity of the touch pad determined by an experiment, and transmits the obtained control value as a control signal Di for adjusting the delay time of the i-th variable delay unit 35-$i$ (Step S90).

When it is determined that the adjustment of the delay time is not carried out in the normal condition, the control unit 50 proceeds to a step (Step S110) of releasing the holding of the touch output to cancel the phase adjustment with respect to the variable delay unit 35-$i$ and remain in a standby mode for the next adjustment.

The control unit 50 then checks whether the i value is equal to the number of the variable delay units 35-1 to 35-$n$ included in the touch sensor (Step S100).

That is, on the assumption that twelve variable delay units are present as described above, the control unit 50 confirms that the adjustment of the delay time for all of the variable delay units 35-1 to 35-$n$ has been carried out when the i value becomes twelve, terminates the adjustment of the delay time, and releases the holding of the touch output to allow the value of the touch output to be renewed to a new value when the touch pad is in the touched state (Step S110).

But when the i value is not twelve, the control unit 50 returns to Step S30 to carry out the adjustment of the delay time for the next variable delay unit 35-($i$+1).

Preferred embodiments of the present invention have been disclosed herein and, although specific terms are employed, they are used and are to be interpreted in a generic and descriptive sense only and not for purpose of limitation.

Accordingly, it will be understood by those of ordinary skill in the art that various changes in form and details may be made without departing from the spirit and scope of the present invention as set forth in the following claims.

The invention claimed is:

1. A touch sensor, comprising:
   an input signal generation unit generating an input signal;
   a reference signal generation unit delaying the input signal by a predetermined time to generate a first signal;
   a plurality of touch sensing signal generation units having a touch pad and delaying the input signal to generate a second signal differently according to whether or not the touch pad is touched;
   a plurality of variable delay units varying a delay time in response to a control value of a control signal and delaying the second signal to generate a varied second signal in response to the varied delay time;
   a plurality of touch signal generation units generating a touch signal according to a time difference between the first signal and the varied second signal; and
   a control unit receiving and analyzing the plurality of touch signals, generating touch outputs when the touch sensor is in an operation mode in which the touch signal is continuously changed, and varying the control signal, obtaining the control signal as a minimum delay value when a value of the touch signals becomes a value indicating that the touch pad is in the touched state, and calculating a difference between the minimum delay value and a sensitivity of the touch pad to determine the control value of the control signal when the touch sensor is in a standby mode in which the touch signal is not changed for a predetermined time.

2. The touch sensor according to claim 1, wherein the reference signal generation unit has a plurality of serially connected inverters.

3. The touch sensor according to claim 1, wherein the reference signal generation unit has a capacitor connected to a ground voltage.

4. The touch sensor according to claim 1, wherein each of the touch sensing signal generation units generates the second signal by delaying the input signal longer than the first signal when the touch pad is in a touched state and delaying the input signal shorter than the first signal when the touch pad is not in a touched state.

5. The touch sensor according to claim 1, wherein each of the variable delay units has a plurality of delay components and receives the control signals from the control unit so that some of the delay components are activated in response to the control signals, and delays the second signals by delay times of the activated delay components to output the varied second signals.

6. The touch sensor according to claim 5, wherein the plurality of delay components are connected serially, and each of the delay components has a multiplexer outputting one of the second signal and an output of a previous delay component in response to the control signals, and a plurality of inverters receiving an output of the multiplexer as an input and delaying the input by a predetermined time to output the delayed input.

7. The touch sensor according to claim 1, wherein each of the touch signal generation units is a flip-flop which latches the varied second signal in response to the first signal and generates the touch signal.

8. The touch sensor according to claim 1, wherein each of the touch signal generation units is a flip-flop which latches the first signal in response to the varied second signal and generates the touch signal.

9. The touch sensor according to claim 1, wherein in the standby state, the control unit holds the most recent touch output until adjustment of the control signal for all of the touch pads is completed.

10. The touch sensor according to claim 9, wherein the control unit sequentially supplies the control signals to the respective variable delay units while the touch sensor is in the standby mode.

11. The touch sensor according to claim 1, wherein the control unit checks whether a current adjustment of the control signal is performed in a normal condition by comparing the minimum delay value obtained in a previous adjustment of the control signal and the minimum delay value obtained in the current adjustment of the control signal, determines the control value using the minimum delay value obtained in the current adjustment of the control signal and generating the determined control value as the control signal upon determination that the adjustment is performed in the normal condition, and outputting the touch output upon determination that the adjustment is not performed in the normal condition.

12. A method of generating a touch signal of a touch sensor, comprising:
   generating an input signal;
   delaying the input signal by a predetermined time to generate a first signal;
   delaying the input signal to generate a second signal differently according to whether a touch pad is touched;
   varying a delay time in response to a control value of a control signal and delaying the second signal to generate a varied second signal in response to the varied delay time;
   generating a touch signal according to a time difference between the first signal and the varied second signal; and
   receiving and analyzing the touch signal, generating a touch output when the touch sensor is in an operation mode in which the touch signal is continuously changed, and adjusting the control signal when the touch sensor is in a standby mode in which the touch signal is not changed for a predetermined time,
   wherein the adjusting of the control signal comprises:

varying the control signal;

obtaining the control signal as a minimum delay value when a value of the touch signal becomes a value indicating that the touch pad is in a touched state while varying the control signal; and determining the control value of the control signal by calculating a difference between the minimum delay value and a sensitivity of the touch pad.

13. The method according to claim 12, further comprising:

holding the most recent touch outputs when the touch sensor is in the standby mode.

14. The method according to claim 13, wherein the adjusting of the control signal further comprises:

checking whether the current adjustment of the control signal is performed in a normal condition by comparing the minimum delay value obtained in the previous adjustment of the delay time and the minimum delay value obtained in the current adjustment of the control signal;

determining the control value using the minimum delay value obtained in the current adjustment of the control signal, and generating the determined control value as the control signal upon determination that the adjustment is performed in the normal condition; and releasing the holding of the touch output upon determination that the adjustment is not performed in the normal condition.

15. The method according to claim 13, further comprising:

releasing the holding of the touch output when the adjustment of the control signal is completed.

* * * * *